US006956222B2

(12) United States Patent
Gilissen et al.

(10) Patent No.: US 6,956,222 B2
(45) Date of Patent: Oct. 18, 2005

(54) LITHOGRAPHIC APPARATUS AND METHOD OF MANUFACTURING A DEVICE

(75) Inventors: Noud Jan Gilissen, Eindhoven (NL); Sjoerd Nicolaas Lambertus Donders, 'S-Hertogenbosch (NL); Martinus Hendrikus Antonius Leenders, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/743,276

(22) Filed: Dec. 23, 2003

(65) Prior Publication Data

US 2004/0178362 A1 Sep. 16, 2004

(30) Foreign Application Priority Data

Dec. 23, 2002 (EP) .............................. 02258866

(51) Int. Cl.[7] ................................................ A61N 5/00
(52) U.S. Cl. ............................... 250/492.2; 250/440.11; 355/72; 355/75; 355/53; 378/34; 378/20; 378/177; 378/187
(58) Field of Search ................. 250/492.2, 440.11; 361/234; 279/128, 3; 248/683; 355/53, 72, 73, 75, 76; 378/34, 20, 177, 187, 18

(56) References Cited

U.S. PATENT DOCUMENTS 3,974,382 A    8/1976  Bernacki
4,384,918 A    5/1983  Abe
4,402,600 A    9/1983  Araihara
4,502,094 A    2/1985  Lewin et al.
4,551,192 A   11/1985  Di Milia et al.
5,350,479 A    9/1994  Collins et al.
5,530,616 A    6/1996  Kitabayashi et al.
5,532,903 A *  7/1996  Kendall ....................... 361/234
5,656,093 A    8/1997  Burkhart et al.
5,885,469 A    3/1999  Kholodenko et al.
6,480,260 B1  11/2002  Donders et al.

FOREIGN PATENT DOCUMENTS

EP    0 806 797 A2   11/1997
EP    0 856 882 A2    8/1998
EP    0 806 797 A3   10/1999
EP    0 856 882 A3   10/1999
GB    2 268 447       1/1994

* cited by examiner

*Primary Examiner*—Jack I. Berman
(74) *Attorney, Agent, or Firm*—Pillsbury Winthrop Shaw Pittman LLP

(57) ABSTRACT

A lithographic projection apparatus includes a radiation system for providing a beam of radiation and a support structure for supporting a patterning device. The patterning device serves to pattern the beam according to a desired pattern. The lithographic projection apparatus includes a substrate table for holding a substrate and a projection system for projecting the patterned beam onto a target portion of the substrate. At least one holding structure includes at least one compliant member holding a pimple plate for holding a removable item for the apparatus.

15 Claims, 1 Drawing Sheet

LITHOGRAPHIC APPARATUS AND METHOD OF MANUFACTURING A DEVICE

The present application claims priority to European Application No. 02258866.9, filed on Dec. 23, 2002, the entirety of which is hereby incorporated into the present application by reference thereto.

BACKGROUND OF THE INVENTION

1. Field of the Invention

The present invention relates to a lithographic projection apparatus and a method of manufacturing a device.

2. Brief Description of Related Art

The term "patterning device" or "patterning structure" as here employed should be broadly interpreted as referring to a device or structure that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below).

An example of such patterning device includes a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of such patterning device includes a programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using a suitable electronic device. In both of the situations described hereabove, the patterning device can comprise one or more programmable mirror arrays. More information on mirror arrays as here referred to can be gleaned, for example, from U.S. Patents U.S. Pat. No. 5,296,891 and U.S. Pat. No. 5,523,193, and PCT patent applications WO 98/38597 and WO 98/33096, which are incorporated herein by reference thereto. In the case of a programmable mirror array, the support structure may be embodied as a frame or table, for example, which may be fixed or movable.

Another example of such patterning device includes a programmable LCD array. An example of such a construction is given in U.S. Patent U.S. Pat. No. 5,229,872, which is incorporated herein by reference thereto. As above, the support structure in this case may be embodied as a frame or table, for example, which may be fixed or movable.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are provided, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference thereto.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference thereto.

In the above apparatus, the mask and substrate may each be securely held ("clamped") so that it can be accurately positioned in the X, Y and Z directions and in rotational orientation about the X, Y and Z axes (referred to as the Rx, Ry and Rz directions). The Z direction is defined as being the direction substantially perpendicular to the plane of the mask or substrate in question (which defines the XY plane). The mask and substrate can be subjected to very large accelerations in their plane, particularly in a step-and-scan apparatus. Accurate positioning of the mask or substrate also requires relatively high stiffness in the Z direction. The clamping arrangement is sufficiently secure to withstand such accelerations and also to provide the necessary stiffness.

Previous clamping arrangements, such as a rigid vacuum clamp, have the problem that deformation of the mask can be caused. This can be as a result of either or both of the mask and the vacuum clamp not being perfectly flat or because of contaminant particles being trapped between the mask and the clamp. The deformation of the mask or substrate leads to distortion of the exposed image which can lead to overlay errors.

A previous attempt to reduce the problem of deformation is to use a membrane which is compliant in the Z direction, for example as disclosed in U.S. Pat. No. 5,532,903, to support the mask. However, this still suffers from the problem of contaminant particles between the membrane and mask and also their lack of rigidity and stiffness.

In order to alleviate the sensitivity to contamination between the mask or substrate and the supporting structure or table, referred to as a chuck, a pimple plate has previously been used between the mask and chuck. The tips of the pimples define the plane on which the mask or substrate is supported, and the spaces between the pimples can receive the contaminants without deforming the plane of the mask or substrate. However, the use of a pimple plate has the problem that three surfaces need to be accurate, namely the top and bottom of the pimple plate and the surface of the chuck on which the bottom of the pimple plate is held. An alternative is to put pimples directly on the chuck, but these can be damaged by cleaning, in which case the whole chuck is damaged, which is costly to replace.

SUMMARY

An aspect of the present invention is to alleviate, at least partially, the above problems.

Accordingly, an aspect of the present invention provides a lithographic projection apparatus comprising a radiation system constructed to provide a beam of radiation; a support structure to support a patterning device, the patterning device serving to pattern the beam of radiation according to a desired pattern and form a patterned beam; a substrate table for supporting a substrate; a projection system that projects the patterned beam onto a target portion of the substrate; and at least one holding structure having at least one compliant member constructed to hold a pimple plate, the pimple plate constructed to hold one of the patterning device and the substrate.

The use of the pimple plate between the removable item (such as the patterning device or substrate) and the compliant member simultaneously reduces the susceptibility to deformation due to contaminants and reduces the stringency on the flatness requirement for the back surface of the pimple plate and the surface of the chuck.

A further aspect of the present invention provides a method of manufacturing a device using a lithographic projection apparatus comprising: providing a beam of radiation; providing a support structure for supporting a patterning device; using the patterning device to pattern the beam of radiation according to a desired pattern forming a patterned beam; providing a substrate table for supporting a substrate; holding one of the patterned beam and the substrate on a pimple plate during operation of the apparatus; holding the pimple plate on at least one compliant member; and projecting the patterned beam onto a target portion of the substrate.

A further aspect of the present invention provides a lithographic projection apparatus, comprising means for projecting the patterned beam of radiation onto a target portion of a substrate; holding means for holding at least one of a patterning device and the substrate; and means for resiliently supporting the holding means.

A further aspect of the present invention provides a lithographic projection apparatus, comprising: a radiation system constructed to provide a beam of radiation; a pimple plate having protrusions extending from a surface, the pimple plate constructed to hold a removable item on the protrusions; a holding structure having at least one compliant member constructed to resiliently hold the pimple plate.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

DETAILED DESCRIPTION OF ILLUSTRATED EMBODIMENTS

In the Figures, corresponding reference symbols indicate corresponding parts.

Figure 1:
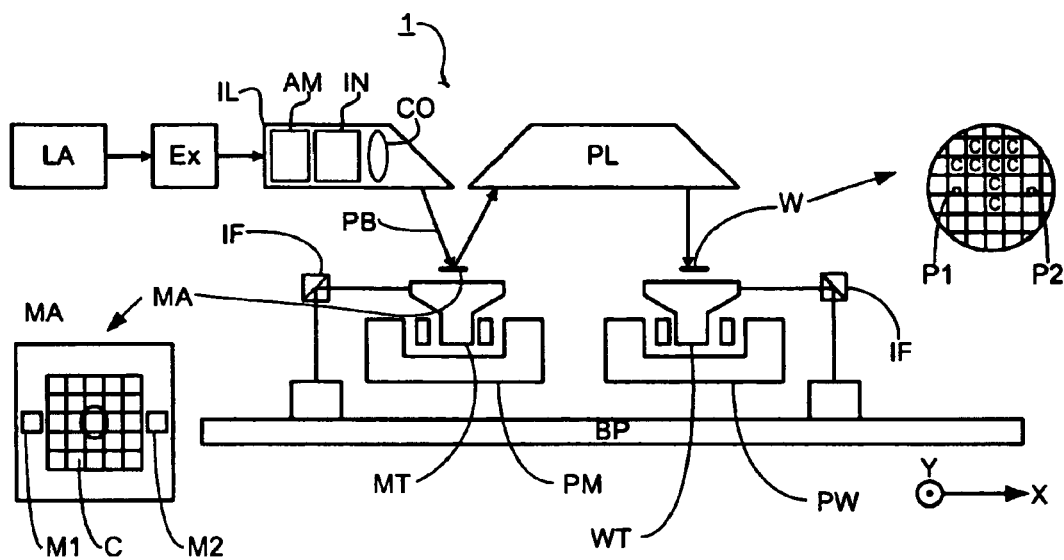
FIG. 1 depicts a lithographic projection apparatus according to an embodiment of the invention.

FIG. 1 schematically depicts a lithographic projection apparatus according to an embodiment of the invention. The apparatus comprises: a radiation system Ex, IL, for supplying a projection beam PB of radiation (e.g. EUV radiation), which in this particular case also comprises a radiation source LA; a first object table (mask table) MT provided with a mask holder for holding a patterning device, illustrated in the form of the mask MA (e.g. a reticle), and connected to first positioning structure for accurately positioning the mask with respect to item PL; a second object table (substrate table) WT provided with a substrate holder for holding a substrate W (e.g. a resist-coated silicon wafer), and connected to second positioning structure for accurately positioning the substrate with respect to item PL; a projection system ("lens") PL (e.g. mirror group) for imaging an irradiated portion of the mask MA onto a target portion C (e.g. comprising one or more dies) of the substrate W.

As here depicted, the apparatus is of a reflective type (e.g. has a reflective mask). However, in general, it may also be of a transmissive type, for example (e.g. with a transmissive mask). Alternatively, the apparatus may employ another kind of patterning devices, such as a programmable mirror array of a type as referred to above.

The source LA (e.g. a laser-produced or discharge plasma source) produces a beam of radiation. This beam is fed into an illumination system (illuminator) IL, either directly or after having a traversed conditioning device, such as a beam expander Ex, for example. The illuminator IL may comprise an adjuster AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. Aspects of the invention and Claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes.

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
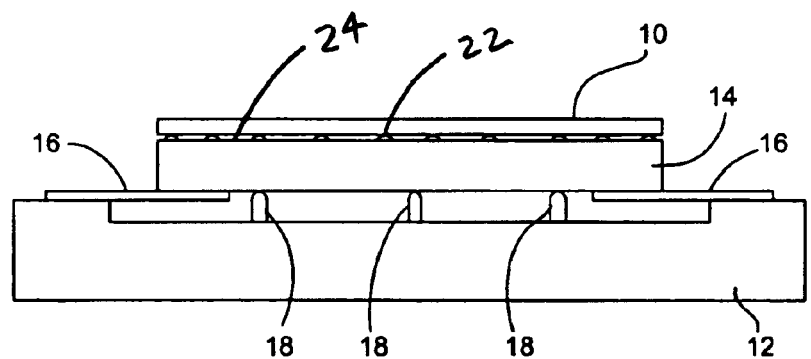
FIG. 2 depicts, in cross-section, a structure for supporting and clamping a mask according to an embodiment of the invention.

FIG. 2 shows the support and clamping arrangement of the present preferred embodiment, in cross-section, for holding a reticle 10 with respect to a table 12. The reticle 10 is held on a pimple plate 14 which minimizes the susceptibility to deformation of the reticle 10 due to contaminant particles. The pimple plate 14 is made out of, for example, an ultra-low expansivity glass or glass-ceramic (e.g. zerodur™, ULE), an ultra-low expansivity ceramic (e.g. Cordierite), or a low expansivity ceramic (e.g. SiSic), and typically has a thickness in the range of 3 mm to 30 mm. The reticle 10 can be held against the pimple plate 14 by any suitable structure, however according to an embodiment of the invention, for use with EUV radiation, the entire radiation path is under vacuum, so that it is preferred to use electrostatic clamping with the reticle 10 forming one electrode and the pimple plate 14 forming another electrode. A voltage difference is applied between the two electrodes and a uniform electrostatic force attracts them to each other. Cooling gases can also be circulated beneath the reticle 10. When the reticle 10 is held against the pimple plate 14 as illustrated in FIG. 2, the reticle 10 is supported by the pimples or tips, or protrusions 22, which extend from a surface 24.

The pimple plate 14 is then held on membranes 16 which constitute compliant members. The membranes 16 may be made out of, for example, the same range of materials as the pimple plate 14, but with a thickness typically in the range of 0.2 mm to 3 mm. In this embodiment each membrane 16 is in the form of a flap whose length is approximately the same as the length of one edge of the pimple plate 14. One edge of each membrane 16 is fixed to the table 12, for example by mechanical clamping or bolting, and the other edge is cantilevered out from the table 12. Two edges of the pimple plate 14 are then in contact with the cantilevered portions of the membrane 16. Again, in the preferred embodiment for use with EUV radiation, electrostatic clamping is used to hold the pimple plate 14 to the membranes 16; the pimple plate 14 forms one electrode and the membranes 16 the other electrode. Alternative embodiments are also contemplated in which, for example, the membrane or membranes are mechanically connected to the pimple plate and electrostatically clamped to the table, or the membranes may be electrostatically clamped to both the pimple plate and the table, or indeed, the membranes may be mechanically fixed to both the pimple plate and the table.

The membranes 16 are compliant, i.e. flexible, in the Z direction and thus can conform to the profile of the rear side of the pimple plate 14, with which they are in contact, thus reducing the stringency of the flatness requirement for the rear side of the pimple plate 14. The pimple plate has greater rigidity than the membranes, so the membranes deform to accommodate the pimple plate profile rather than the other way round. The pimple plate is sufficiently stiff to ensure flatness of the top surface which is in contact with the reticle.

The pimple plate is supported kinematically. The membranes 16 provide the necessary clamping forces in the XY plane to define the X, Y and Rz positioning and to hold the reticle 10 when accelerated, for example in a scanner. Further information regarding the use of Z-compliant membranes for clamping can be gleaned, for example, from EP 1,107,066.

The reticle 10 is supported in the vertical direction by supplying a force in the Z direction using three supports in the form of pins 18 which are provided on the table 12 to contact the rear side of the pimple plate 14. The three points of contact uniquely define a plane and thus determine the Z, Rx and Ry positioning of the pimple plate 14 and reticle 10. Three points are the minimum necessary to support the pimple plate 14 and the reticle 10 without over-constraining them to adopt a particular deformed shape. Preferably the pins 18 are located at Bessell points, which minimizes the sagging of the pimple plate 14 and reticle 10. Optionally, one or more further support pins 18 may be provided, but preferably such further pins would be free to move in the Z direction but biased with a small force to support a portion of the total weight carried by the supports 18. These further supports should, preferably, be damped in order to eliminate vibration of the reticle 10. Some proportion of the weight of pimple plate 14 and reticle 10 can also be taken by the membranes 16, in addition to the pins 18.

The pimple plate 14 is sometimes used upside down, in which case further gravity compensation is needed. This force in the Z direction can be applied in a variety of ways, for example over the entire area of the pimple plate, or only at the location of the pins 18.

In the preferred embodiment, one or more of the pins 18 is used to provide electrical connection to the pimple plate 14 for use in the electrostatic clamping of the reticle 10 and membranes 16 to the pimple plate 14. The pimple plate 14 is also made relatively thick so as to minimize any distortion of it, due to being supported on the pins 18 and/or being clamped to the membranes 16, such that the rigidity of the pimple plate 14 can maintain flatness and minimize deformation of the reticle 10. The stiffness of the pimple plate 14 may also be used to suppress deformation due to tensions in the reticle 10, eventually in combination with forces on the pins 18.

According to alternative embodiments of the invention, the membrane 16 can take forms other than the two flaps illustrated in FIG. 2. For example, a one-piece membrane as a continuous sheet under the pimple plate could be used, with the pins 18 either making contact with the membrane, or passing through apertures in the membrane to contact the pimple plate directly. However, a one-piece membrane may be disadvantageous because of creep of the membrane over time.

Although the above description has referred to an arrangement for holding a reticle 10, it is, of course, to be understood that the reticle could equally well be a different item in the lithographic projection apparatus, such as another form of mask or patterning device, or a wafer or substrate, or any optical component in the apparatus, such as a mirror or lens and so on.

While specific embodiments of the invention have been described above, it will be appreciated that aspects of the invention may be practiced otherwise than as described. The description is not intended to limit aspects of the invention.

What is claimed is:

1. A lithographic projection apparatus, comprising:
   a radiation system constructed to provide a beam of radiation;
   a support structure to support a patterning device, said patterning device serving to pattern said beam of radiation according to a desired pattern and form a patterned beam;
   a substrate table for supporting a substrate;
   a projection system that projects said patterned beam onto a target portion of said substrate; and
   at least one holding structure having at least one compliant member constructed to hold a pimple plate, said pimple plate constructed to hold one of said patterning device and said substrate.

2. A lithographic projection apparatus according to claim 1, wherein said at least one compliant member includes a membrane.

3. A lithographic projection apparatus according to claim 1, wherein said at least one compliant member includes a pair of parallel flaps.

4. A lithographic projection apparatus according to claim 3, wherein each of said pair of parallel flaps is supported along the respective length of each of said pair of parallel flaps.

5. A lithographic projection apparatus according to claim 1, wherein said pimple plate is substantially rigid in comparison with said at least one compliant member.

6. A lithographic projection apparatus according to claim 1, further comprising:
   a plurality of supports for supporting said at least one of said patterning device and said substrate and each of said plurality of supports extending substantially perpendicular to a plane of said at least one of said patterning device and said substrate.

7. A lithographic projection apparatus according to claim 6, wherein said plurality of supports are arranged to support said pimple plate at Bessell points.

8. A lithographic projection apparatus according to claim 7, wherein said plurality of supports is three fixed supports.

9. A lithographic projection apparatus according to claim 6, wherein at least one of said plurality of supports provides electrical contact with said pimple plate.

10. A lithographic projection apparatus according to claim 1, further comprising:
    an electrostatic clamp constructed to clamp said pimple plate to at least one of said one of said patterning device and said substrate and said at least one compliant member.

11. A lithographic projection apparatus according to claim 1, wherein said beam of radiation comprises EUV radiation.

12. A lithographic projection apparatus according to claim 1, wherein said at least one of said support structure and said substrate table includes said at least one holding structure.

13. A method of manufacturing a device using a lithographic projection apparatus comprising:

providing a beam of radiation;

providing a support structure for supporting a patterning device;

using the patterning device to pattern the beam of radiation according to a desired pattern forming a patterned beam;

providing a substrate table for supporting a substrate;

holding one of the patterning device and the substrate on a pimple plate during operation of the apparatus;

holding the pimple plate on at least one compliant member; and projecting the patterned beam onto a target portion of the substrate.

14. A lithographic projection apparatus, comprising:

a radiation system constructed to provide a beam of radiation;

a pimple plate having protrusions extending from a surface, said pimple plate constructed to hold a removable item on said protrusions;

a holding structure having at least one compliant member constructed to resiliently hold said pimple plate.

15. A lithographic projection apparatus according to claim 14, wherein:

said removable item is one of a patterning device serving to pattern said beam of radiation according to a desired pattern and form a patterned beam and a substrate.

* * * * *